United States Patent
Hayami et al.

(10) Patent No.: US 8,771,461 B2
(45) Date of Patent: Jul. 8, 2014

(54) PLASMA PROCESSING APPARATUS

(75) Inventors: Toshihiro Hayami, Amagasaki (JP); Yasuyuki Hayashi, Amagasaki (JP)

(73) Assignee: SPP Technologies Co., Ltd., Tokyo (JP)

( * ) Notice: Subject to any disclaimer, the term of this patent is extended or adjusted under 35 U.S.C. 154(b) by 923 days.

(21) Appl. No.: 12/922,520

(22) PCT Filed: Dec. 3, 2008

(86) PCT No.: PCT/JP2008/071960
§ 371 (c)(1),
(2), (4) Date: Sep. 14, 2010

(87) PCT Pub. No.: WO2009/113213
PCT Pub. Date: Sep. 17, 2009

(65) Prior Publication Data
US 2011/0005684 A1 Jan. 13, 2011

(30) Foreign Application Priority Data
Mar. 14, 2008 (JP) .................. 2008-065252

(51) Int. Cl.
*H01L 21/306* (2006.01)
*C23C 16/00* (2006.01)

(52) U.S. Cl.
USPC ........... 156/345.35; 118/723 R; 118/723 ER; 118/723 IR; 118/723 MR; 156/345.41; 156/345.47; 156/345.48

(58) Field of Classification Search
CPC .............. H01J 37/32798; H01J 37/32807; H01J 37/3288; H01J 37/32889; H01J 37/32431; H01J 37/32458; H01J 37/32568; H01J 37/32605; H01J 37/32082; H01J 37/32091; H01J 37/321; H01J 37/32192

USPC ..... 118/723 R, 723 E, 723 ER, 723 I, 723 IR, 118/723 AN, 723 MW, 723 MR; 156/345.35, 156/345.36, 345.41, 345.47, 345.48, 156/345.49; 315/111.51
See application file for complete search history.

(56) References Cited

U.S. PATENT DOCUMENTS 6,499,424 B2 * 12/2002 Kazumi et al. ............ 118/723 R
6,700,089 B1 * 3/2004 Hirooka ..................... 219/121.4

FOREIGN PATENT DOCUMENTS

| EP | 1191570 A2 | 3/2002 |
|---|---|---|
| JP | 2000-268995 A | 9/2000 |
| JP | 2007-266185 A | 10/2007 |

OTHER PUBLICATIONS

International Search Report for PCT/JP2008/071960 issued on Mar. 17, 2009.

*Primary Examiner* — Luz Alejandro Mulero
(74) *Attorney, Agent, or Firm* — Smith Patent Office (57) ABSTRACT

The present invention relates to a plasma processing apparatus in which it is possible to efficiently perform maintenance of a processing chamber. A plasma processing apparatus has a processing chamber including a lower chamber and an upper chamber, a platen on which a silicon substrate is placed, a processing gas supply device, coils, high-frequency power supply unit for coil, an elevating board with a through hole provided to be vertically movable, an elevating mechanism for supporting and moving the elevating board, and a fixing mechanism for fixing the upper chamber. The fixing member is configured from a fixing board, first fixing bolts for connecting and fixing a top plate to the elevating board using the fixing board, second fixing bolts for fixing a flange portion of a holding member to an annular plate, and third fixing bolts for fixing the annular plate to a sidewall of the lower chamber.

20 Claims, 6 Drawing Sheets

PLASMA PROCESSING APPARATUS

TECHNICAL FIELD

The present invention relates to a plasma processing apparatus in which a predetermined processing gas is supplied into a processing chamber and a plasma is formed therefrom, and a substrate disposed in the processing chamber is processed with the plasma formed from the processing gas.

BACKGROUND ART

Conventionally, as a plasma processing apparatus as described above, for example, an apparatus disclosed in the Japanese Unexamined Patent Application Publication No. 2000-268995 has been known. This plasma processing apparatus has a processing chamber configuring a reaction chamber, a susceptor arranged in the processing chamber for holding a substrate on its upper surface, a gas supply mechanism for supplying a processing gas into the processing chamber, a plasma generating mechanism for forming a plasma from a processing gas supplied into the processing chamber, a high-frequency power supply unit for applying high-frequency voltage to the plasma generating mechanism, and other components.

The processing chamber is configured from a bottom member open at the top thereof, an annular body which is provided so that its lower surface is in contact with the upper surface of a sidewall of the bottom member, a lid body which is provided so that its lower surface is in contact with the upper surface of the annular body, and other components. The annular body is configured from a cylindrical electrode formed in a hollow cylindrical shape, an annular upper insulating material and an annular lower insulating material which are provided at an upper end portion and lower end portion of the cylindrical electrode respectively, and an annular holding member connected to the upper end of the upper insulating material and the lower end of the lower insulating material for holding the upper and lower insulating materials.

The plasma generating mechanism is configured from the cylindrical electrode configuring a part of the processing chamber, and annular permanent magnets which are provided on the outer circumferential surfaces of the upper and lower insulating materials respectively. The high-frequency power supply unit applies high-frequency voltage to the cylindrical electrode.

When plasma processing is performed, various products adhere to the inner surface of the processing chamber. The adherent products cause a problem that they are pulverized into particles and the particles adhere to the substrate. For this reason, the processing chamber is regularly cleaned to remove the adherent products. It is noted that the processing chamber is cleaned, for example, in such a way that, after disassembling the processing chamber, the components thereof are cleaned with a predetermined cleaning fluid or with pure water.

In the above-described conventional plasma processing apparatus, the cylindrical electrode and the upper and lower insulating materials are held by the holding member, and thereby they are integrally configured. Therefore, said plasma processing apparatus is advantageous for disassembling and assembling the processing chamber as compared with a case where the cylindrical electrode and the upper and lower insulating materials are disassembled into individual pieces and then assembled.

Patent document 1: Japanese Unexamined Patent Application Publication No. 2000-268995

DISCLOSURE OF INVENTION

Problem Invention is to Solve

However, in the above-described conventional plasma processing apparatus, even when maintenance is performed on only a part of the components, for example, only the bottom member or only the cylindrical electrode, it is necessary to disassemble all the components including the lid body and the like which are not maintenance targets. Accordingly, the operation for disassemble the processing chamber and the operation for assembling the processing chamber take time, and therefore there is a problem that it is not possible to efficiently perform maintenance.

The present invention has been achieved in view of the above-described circumstances, and an object thereof is to provide a plasma processing apparatus in which it is possible to efficiently perform maintenance of a processing chamber.

Means for Resolving the Problem

To achieve the above object, the present invention relates to a plasma processing apparatus comprising:

a processing chamber configured in a vertically two-divided configuration of an upper chamber and a lower chamber, the lower chamber having a substrate disposed therein;

gas supply means for supplying a processing gas into the upper chamber;

plasma generating means for forming a plasma from a processing gas supplied into the upper chamber; and voltage applying means for applying high-frequency voltage to the plasma generating means, the lower chamber having an inner space open at the top thereof, the upper chamber having an inner space open at the bottom thereof, said inner spaces communicating with each other, characterized in that:

the plasma processing apparatus further comprises an elevating board which is disposed horizontally and provided to be vertically movable and to which at least a part of members configuring the upper chamber is attached, elevating means for supporting and moving up and down the elevating board, and at least three fixing means, first, second and third fixing means, for fixing the upper chamber;

the upper chamber is configured from at least an annular plate the lower surface on the outer peripheral side of which is in contact with the upper portion of the lower chamber, a sidewall member which is formed in a hollow cylindrical shape and the lower end portion of which is placed on the annular plate, and a top plate which is placed on the upper end portion of the sidewall member;

the elevating board has a vertically penetrating through hole having such a size that the top plate can pass therethrough;

the plasma generating means is disposed outside the sidewall member and fixed on the lower surface of the elevating board;

the first fixing means is configured to connect and fix the elevating board and the top plate and to be capable of releasing the connection and fixing;

the second fixing means is configured to connect and fix the elevating board and the annular plate and to be capable of releasing the connection and fixing; and the third fixing means is configured to fix the annular plate to the lower chamber and to be capable of releasing the fixing.

According to the present invention, for example, in performing plasma processing such as etching, ashing or deposition on a substrate to be processed such as a silicon substrate or a glass substrate, a processing gas is supplied into the processing chamber by the gas supply means and high-frequency voltage is applied to the plasma generating means by the voltage applying means, and a plasma is thereby formed from the processing gas. Thereby, a substrate which is appropriately loaded into the processing chamber is processed by the plasma formed from the processing gas.

When such plasma processing is performed, various products adhere to the inner surface of the processing chamber. Maintenance of the processing chamber such as removal of the adherent products can be performed in the following manner.

That is, when maintenance is performed on the top plate of the upper chamber, the connection and fixing between the elevating board and the top plate by the first fixing means is released. This allows only the top plate to be detached, and therefore the top plate can be easily detached from the plasma processing apparatus to perform maintenance thereon. After the maintenance, the top plate is placed on the upper end portion of the sidewall member and then the top plate is connected and fixed to the elevating board by the first fixing means, thereby easily assembling the plasma processing apparatus.

When maintenance is performed on the sidewall member of the upper chamber, the connection and fixing between the elevating board and the annular plate by the second fixing means is initially released, and then the elevating board is moved up by the elevating means and thereby the top plate, the first fixing means and the plasma generating means are moved upward together with the elevating board. This allows only the sidewall member which is not moved upward and remains there to be detached. Therefore, the sidewall member can be easily detached from the plasma processing apparatus to perform maintenance thereon. After the maintenance, the sidewall member is placed on the annular plate, and the top plate, the first fixing member and the plasma generating means are moved downward by moving down the elevating board by means of the elevating means, and then the elevating board is connected and fixed to the annular plate by the second fixing means, thereby easily assembling the plasma processing apparatus.

When maintenance is performed on the annular plate of the upper chamber, in the state where the sidewall member is detached, the fixing between the lower chamber and the annular plate by the third fixing means is also released. Thereby, the annular plate can be easily detached from the plasma processing apparatus to perform maintenance thereon. After the maintenance, the annular plate is fixed to the lower chamber by the third fixing means and the sidewall member is placed on the annular plate, and then the elevating board is moved down by the elevating means and the elevating board is connected and fixed to the annular plate by the second fixing means, thereby easily assembling the plasma processing apparatus.

When maintenance is performed on the lower chamber, the fixing between the lower chamber and the annular plate by the third fixing means is initially released, and then the elevating board is moved up by the elevating means and thereby the top plate, the first fixing means, the plasma generating means, the second fixing means, the sidewall member and the annular plate are moved upward together with the elevating board, that is, the whole upper chamber is moved upward. This allows the lower chamber to be open, thereby easily performing maintenance on the lower chamber. After the maintenance, the top plate, the first fixing means, the plasma generating means, the second fixing means, the sidewall member and the annular plate are moved downward by moving down the elevating board by means of the elevating means, and then the annular plate is fixed to the lower chamber by the third fixing means, thereby easily assembling the plasma processing apparatus.

Thus, according to the plasma processing apparatus of the present invention, releasing the fixing of the top plate by the first fixing means and moving up the elevating board by means of the elevating means after releasing the fixing of the annular plate by the second fixing means or the fixing of the annular plate by the third fixing means enable a part which is a maintenance target, of the parts configuring the processing chamber, to be easily detached from the plasma processing apparatus. Further, when the part is returned after maintenance, it is necessary only to perform the reverse of the operation for detaching the part. Therefore, maintenance such as exchanging or cleaning a target part can be performed easily and in a short time.

Engagement portions which engage with each other to position the top plate with respect to the sidewall member may be formed on the top plate and at the upper end portion of the sidewall member respectively. Further, engagement portions which engage with each other to position the sidewall member with respect to the annular plate may be formed on the annular plate and at the lower end portion of the sidewall member respectively. Furthermore, engagement portions which engage with each other to position the annular plate with respect to the lower chamber may be formed in the lower surface of the annular plate and at the upper portion of the lower chamber respectively. When thus configured, it is possible to facilitate the operations for attaching the top plate, sidewall member and annular plate which have been detached and it is possible to prevent reduction of assembly accuracy.

Furthermore, the plasma processing apparatus may further comprise a cover body for covering at least the elevating board, the elevating means and the upper chamber, the cover body having an operation hole penetrating from the outside to the inside thereof at a lateral position relative to the upper chamber, and a door for opening and closing the operation hole. In this case, the operator opens the door and performs maintenance through the operation hole. When configured in this way, the operator is prevented from being injured during the operations of the elevating means and elevating board and the high frequency is prevented from affecting the operator's body, thereby protecting the operator.

Effects of the Invention

As described above, according to the plasma processing apparatus of the present invention, it is possible to efficiently perform maintenance of the processing chamber.

LEGEND

1 Etching apparatus (Plasma processing apparatus)
11 Processing chamber
12 Lower chamber
13 Upper chamber
14 Annular plate
15 Sidewall member
16 Top plate
20 Platen
24 Exhaust device
27 Gas supply device
31 Coil
32 Holding member
33 High-frequency power supply unit for coil
34 High-frequency power supply unit for platen
41 Elevating board
42 Elevating mechanism
47 Fixing board
48, 49 First fixing bolt
50 Second fixing bolt
51 Third fixing bolt
55 Cover body
56 Lower cover
57 Upper cover
60 Door
K Silicon substrate

BEST MODE FOR CARRYING OUT THE INVENTION

Figure 1:
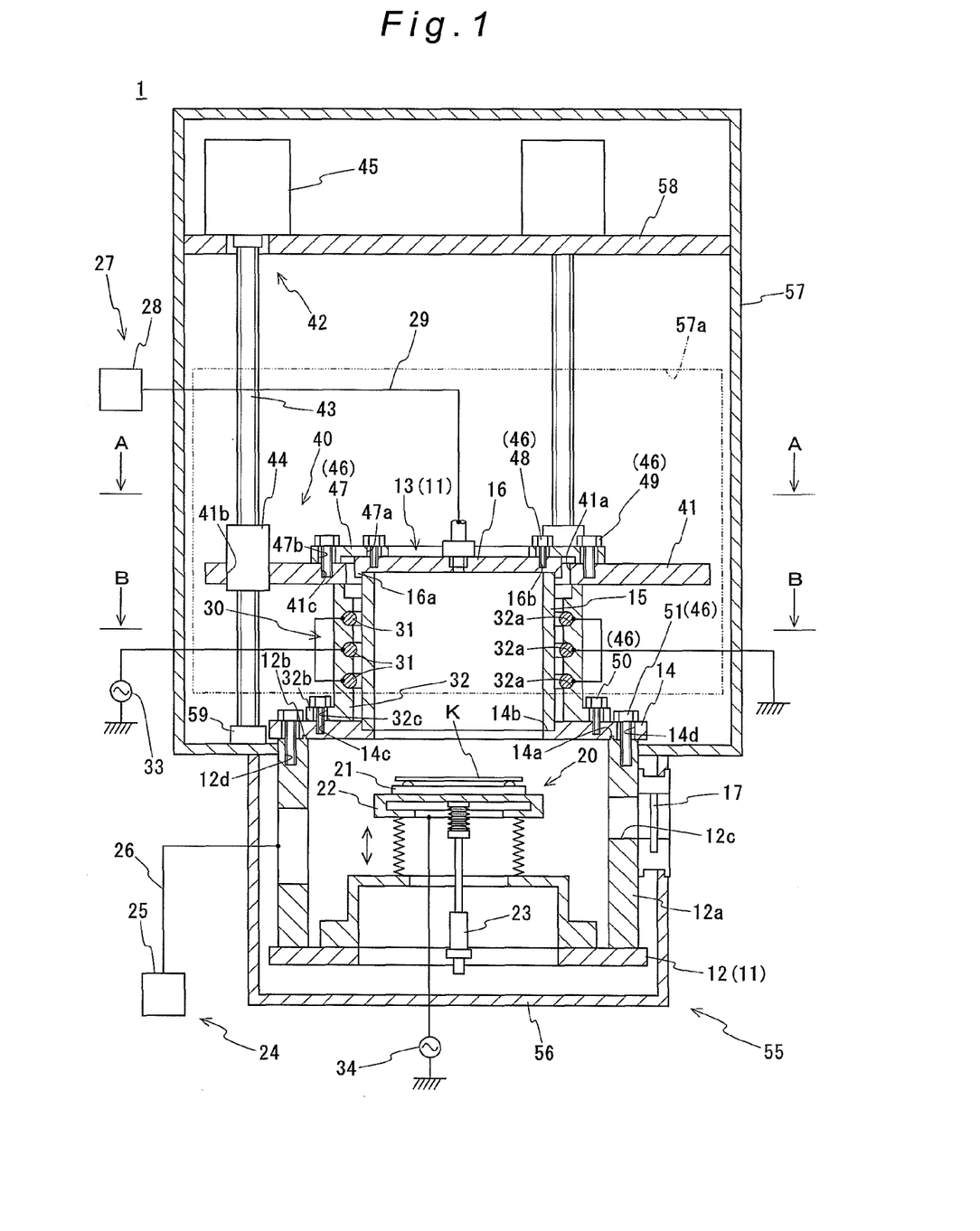
FIG. 1 is a sectional view showing a schematic configuration of an etching apparatus according to one embodiment of the present invention.

Hereinafter, a specific embodiment of the present invention will be described with reference to the accompanying drawings. FIG. 1 is a sectional view showing a schematic configuration of an etching apparatus according to one embodiment of the present invention, FIG. 2 is a sectional view taken along the arrow A-A in FIG. 1, and FIG. 3 is a sectional view taken along the arrow B-B in FIG. 1.

Figure 2:
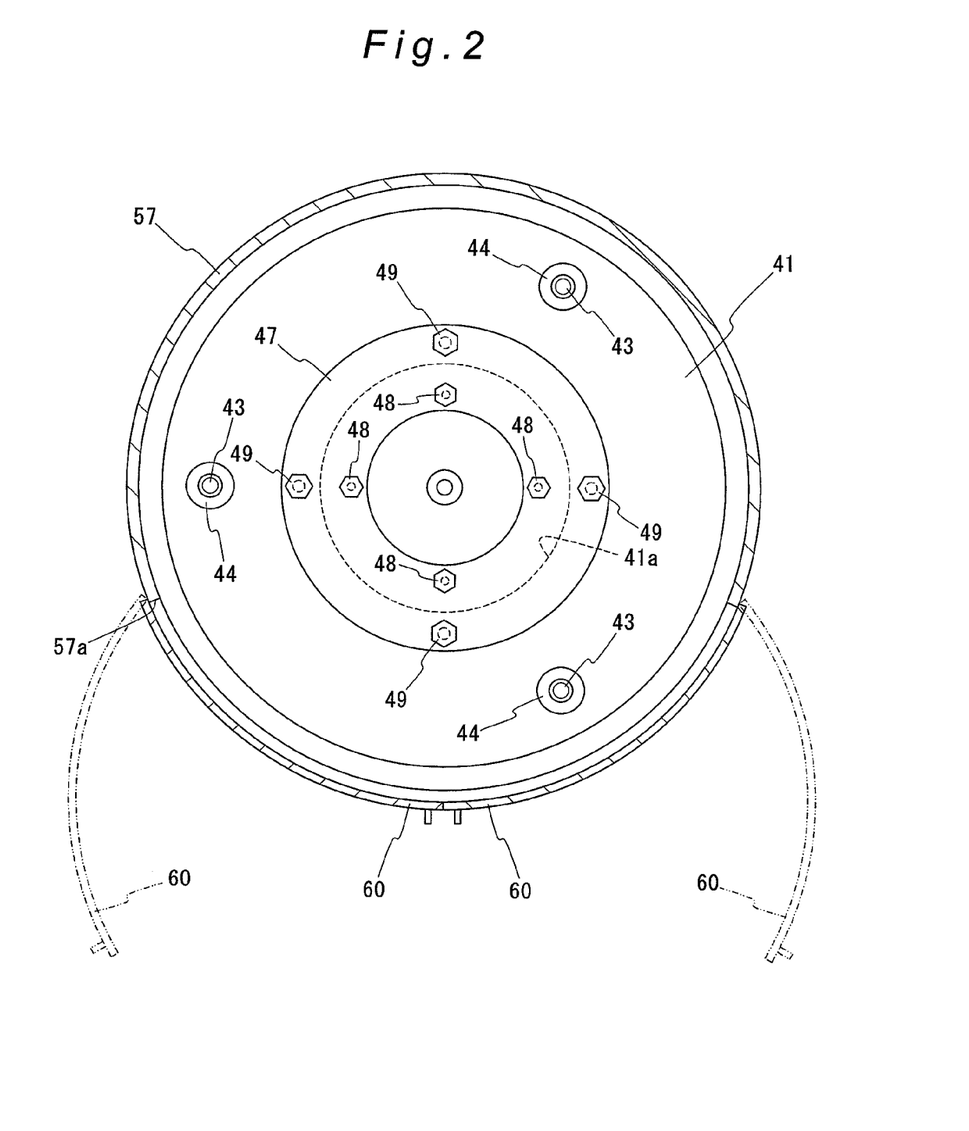
FIG. 2 is a sectional view taken along the arrow A-A in FIG. 1.
Figure 3:
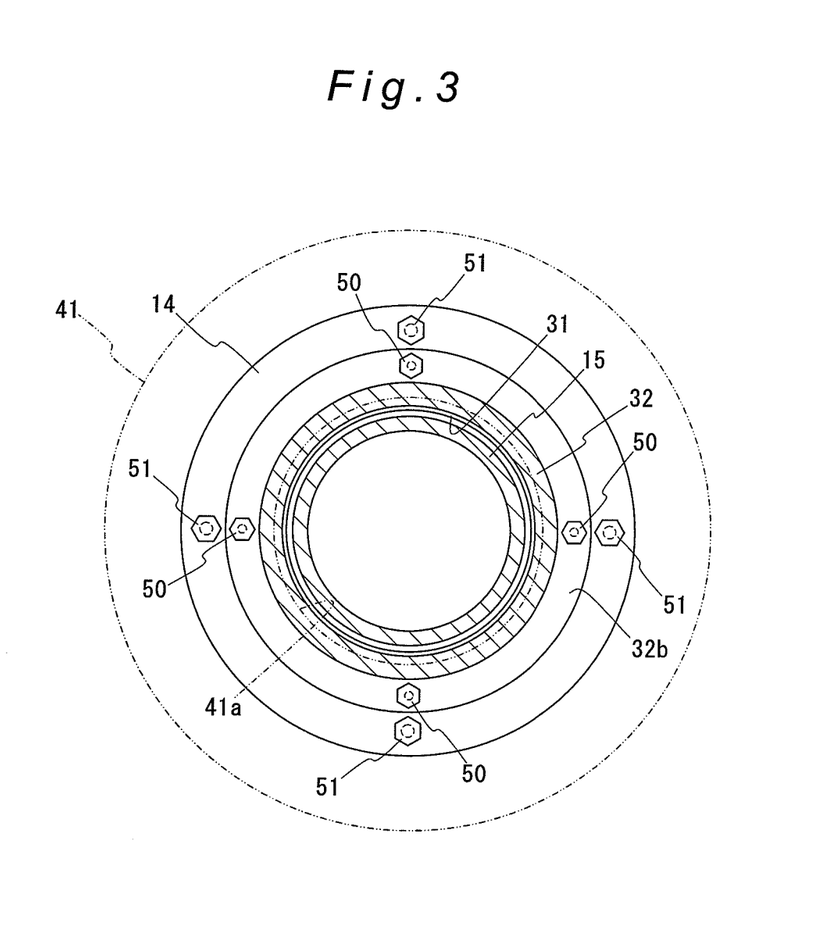
FIG. 3 is a sectional view taken along the arrow B-B in FIG. 1.

As shown in FIGS. 1 to 3, an etching apparatus 1 which is a plasma processing apparatus of the embodiment has a processing chamber 11 configured in a vertically two-divided configuration of a lower chamber 12 and an upper chamber 13, a platen 20 which is disposed in the lower chamber 12 to be vertically movable and on which a silicon substrate K to be etched is placed, an elevating cylinder 23 for moving up and down the platen 20, an exhaust device 24 for reducing the pressure within the processing chamber 11, a gas supply device 27 for supplying a processing gas into the upper chamber 13, a plurality of coils (a plasma generating mechanism) 30 disposed outside the upper chamber 13, a high-frequency power supply unit for coil 33 for applying high-frequency voltage to the coils 30, a high-frequency power supply unit for platen 34 for applying high-frequency voltage to the platen 20, an elevating device 40 for moving up and down the upper chamber 13, a fixing mechanism 46 for fixing the upper chamber 13, a cover body 55 for covering the processing chamber 11 and the elevating device 40 from the outside, a controller (not shown) for controlling operations of the elevating cylinder 23, exhaust device 24, gas supply device 27, high-frequency power supply unit for coil 33, high-frequency power supply unit for platen 34 and elevating device 40, and other components.

The lower chamber 12 has an inner space open at the top thereof, the upper chamber 13 has an inner space open at the bottom thereof, and these inner spaces communicate with each other. Further, the lower chamber 12 has an annular sidewall 12a, and the sidewall 12a has an annular engagement protrusion 12b formed in the upper end surface thereof. Furthermore, the sidewall 12a has an opening 12c formed thereon which is opened and closed by a shutter 17 and through which a silicon substrate K is loaded and unloaded.

The upper chamber 13 is configured from an annular plate 14 the lower surface on the outer peripheral side of which is in contact with the upper end surface of the sidewall 12a of the lower chamber 12, a sidewall member 15 which is formed in a hollow cylindrical shape and the lower end of which is placed on the annular plate 14 on the inner peripheral side of the annular plate 14, and a top plate 16 the lower surface on the outer peripheral side of which is placed on the upper end surface of the sidewall member 15.

The annular plate 14 has an annular engagement groove 14a which is formed in the lower surface on the outer peripheral side thereof and which engages with the engagement protrusion 12b of the sidewall 12a of the lower chamber 12, and has an annular engagement concave 14b which is formed at the inner peripheral edge of the upper surface thereof. The top plate 16 has an annular engagement protrusion 16a which is formed in the lower surface on the outer peripheral side thereof. The lower end of the sidewall member 15 is formed as an engagement portion to engage with the engagement concave 14b of the annular plate 14, and the upper end thereof is formed as an engagement portion to engage with the engagement protrusion 16a of the top plate 16.

The platen 20 is configured from an upper member 21 and a lower member 22 which are disposed vertically. The silicon substrate K is placed on the upper member 21, and the elevating cylinder 23 is connected to the lower member 22.

The exhaust device 24 is configured from the exhaust pump 25 and an exhaust pipe 26 connecting the exhaust pump 25 and the lower chamber 12. Gas within the lower chamber 12 is discharged by the exhaust pump 25 through the exhaust pipe 26, thereby reducing the pressure within the processing chamber 11 to a predetermined pressure.

The gas supply device 27 is configured from a processing gas supply unit 28 for supplying an etching gas (for example, $SF_6$ gas) and an etching-resistant layer forming gas (for example, $C_4F_8$ gas) as a processing gas, and a processing gas supply pipe 29 connecting the processing gas supply unit 28 and the top plate 16 of the upper chamber 13. Etching gas and etching-resistant layer forming gas are each supplied from the processing gas supply unit 28 into the upper chamber 13 through the processing gas supply pipe 29.

The plasma generating mechanism 30 is configured from a plurality of annular coils 31 which are aligned vertically around the sidewall member 15 and a holding member 32 which is formed in a hollow cylindrical shape and which has holding holes 32a for holding the coils 31 formed in the inner peripheral surface thereof. The holding member 32 has a flange portion 32b formed at the lower end of the outer peripheral surface thereof, and the lower end surface of the holding member 32 is in contact with the upper surface of the annular plate 14 and the upper end portion thereof is fixed on the lower surface of an elevating board 41 of the elevating device 40.

The high-frequency power supply unit for coil 33 applies high-frequency voltage to the coils 31 to form a magnetic field inside the upper chamber 13, and an electric field induced by the magnetic field causes a plasma to be formed from etching gas or etching-resistant layer forming gas supplied into the upper chamber 13. The high-frequency power supply unit for platen 34 applies high-frequency voltage to the platen 20 to generate a potential difference (bias potential) between the platen 20 and the plasma.

The elevating device 40 has the elevating board 41 which is arranged horizontally at almost the same height position as the top plate 16 and is provided to be vertically movable, and an elevating mechanism 42 for supporting and moving up and down the elevating board 41. The elevating board 41 has a through hole 41a formed thereon which penetrates vertically and which has a diameter larger than the outer diameter of the top plate 16. The elevating mechanism 42 is configured from ball screws 43 arranged so that their respective axes are aligned along the vertical direction and they are rotatable about their respective axes, nuts 44 which are screwed onto the ball screws 43 and move along the ball screws 43, and drive motors 45 which are connected to the upper end portions of the ball screws 43 and rotate the ball screws 43 about their respective axes. The nuts 44 are inserted into mounting holes 41b of the elevating board 41 and are fixed. It is noted that three sets of the ball screw 43, nut 44, drive motor 45 and mounting hole 41b are provided at regular intervals in the circumferential direction.

The fixing mechanism 46 is configured from a fixing board 47 of an annular shape, first fixing bolts 48, 49 for connecting and fixing the top plate 16 to the elevating board 41 using the fixing board 47, second fixing bolts 50 for fixing the flange portion 32b of the holding member 32 to the annular plate 14, and third fixing bolts 51 for fixing the annular plate 14 to the sidewall 12a of the lower chamber 12. It is noted that four sets of the first fixing bolts 48, 49, second fixing bolt 50 and third fixing bolt 51 are provided at regular intervals in the circumferential direction. It is further noted that the holding member 32 functions also as a connecting member for connecting the lower surface of the elevating board 41 and the upper surface of the annular plate 14.

With respect to some of the first fixing bolts 48, 49, their tip portions are each inserted through one of through holes 47a formed on the fixing board 47 from the upper side thereof and screwed into one of screw holes 16b formed in the upper surface of the top plate 16 (they are indicated by numeral 48). With respect to the others, their tip portions are each inserted through one of through holes 47b formed on the fixing board 47 from the upper side thereof and screwed into one of screw holes 41c formed in the upper surface of the elevating board 41 (they are indicated by numeral 49).

With respect to the second fixing bolts 50, their tip portions are each inserted through one of through holes 32c formed on the flange portion 32b from the upper side thereof and screwed into one of screw holes 14c formed in the upper surface of the annular plate 14. With respect to the third fixing bolts 51, their tip portions are each inserted through one of through holes 14d formed on the annular plate 14 from the upper side thereof and screwed into one of screw holes 12d formed in the upper end surface of the sidewall 12a.

The cover body 55 is configured from a lower cover 56 for covering the lower chamber 12 and an upper cover 57 for covering the upper chamber 13 and the elevating device 40. The upper cover 57 covers the side over the upper end portion of the sidewall 12a of the lower chamber 12, and the lower cover 56 covers the side under the upper end portion of the sidewall 12a of the lower chamber 12.

On the inner surface of the upper cover 57, a support board 58 for supporting the drive motors 45 is arranged at a position above the elevating board 41 and support members 59 for supporting the lower end portions of the ball screws 43 to be rotatable about their respective axes are disposed. Further, the upper cover 57 has an operation hole 57a penetrating from the outside to the inside thereof at a lateral position relative to the upper chamber 13 and a double door 60 for opening and closing the operation hole 57a.

The controller (not shown) controls the operations of the elevating cylinder 23, exhaust device 24, gas supply device 27, high-frequency power supply unit for coil 33, high-frequency power supply unit for platen 34 and elevating device 40. Specifically, the controller alternately repeats an etching process in which high-frequency voltage is applied to the coils 31 and the platen 20 by the high-frequency power supply unit for coil 33 and the high-frequency power supply unit for platen 34 respectively, an etching gas is supplied into the processing chamber 11 from the processing gas supply unit 28, and then the pressure within the processing chamber 11 is set to a predetermined pressure by exhaust pump 25, and an etching-resistant layer forming process in which high-frequency voltage is applied to the coils 31 by the high-frequency power supply unit for coil 33, an etching-resistant layer forming gas is supplied into the processing chamber 11 from the processing gas supply unit 28, and then the pressure within the processing chamber 11 is set to a predetermined pressure by the exhaust pump 25.

Further, the controller (not shown) causes the drive motors 45 to rotate the ball screws 43 about their respective axes, and thereby the nuts 44 are moved upward or downward along the ball screws 43. Thereby, the elevating board 41 is moved up or down.

According to the etching apparatus 1 of the embodiment configured as described above, the etching process and the etching-resistant layer forming process are alternately repeated. In the etching process, a plasma is formed from etching gas, and radicals in the plasma react with silicon atoms and ions in the plasma are moved toward the platen 20 by a bias potential and collide with the silicon substrate K. Thereby, the silicon substrate K is etched. On the other hand, in the etching-resistant layer forming process, a plasma is formed from etching-resistant layer forming gas, and polymers which are generated from radicals in the plasma deposit on the surface of the silicon substrate K (sidewalls and bottom surfaces of trenches and/or holes fabricated by the etching and the like.). Thereby, an etching-resistant layer (fluorocarbon film) is formed. In this way, the etching of the silicon substrate K proceeds.

After such plasma processing is performed, various products adhere to the inner surface of the processing chamber 11. Maintenance of the processing chamber 11 such as removal of the adherent products can be performed in the following manner.

Figure 4:
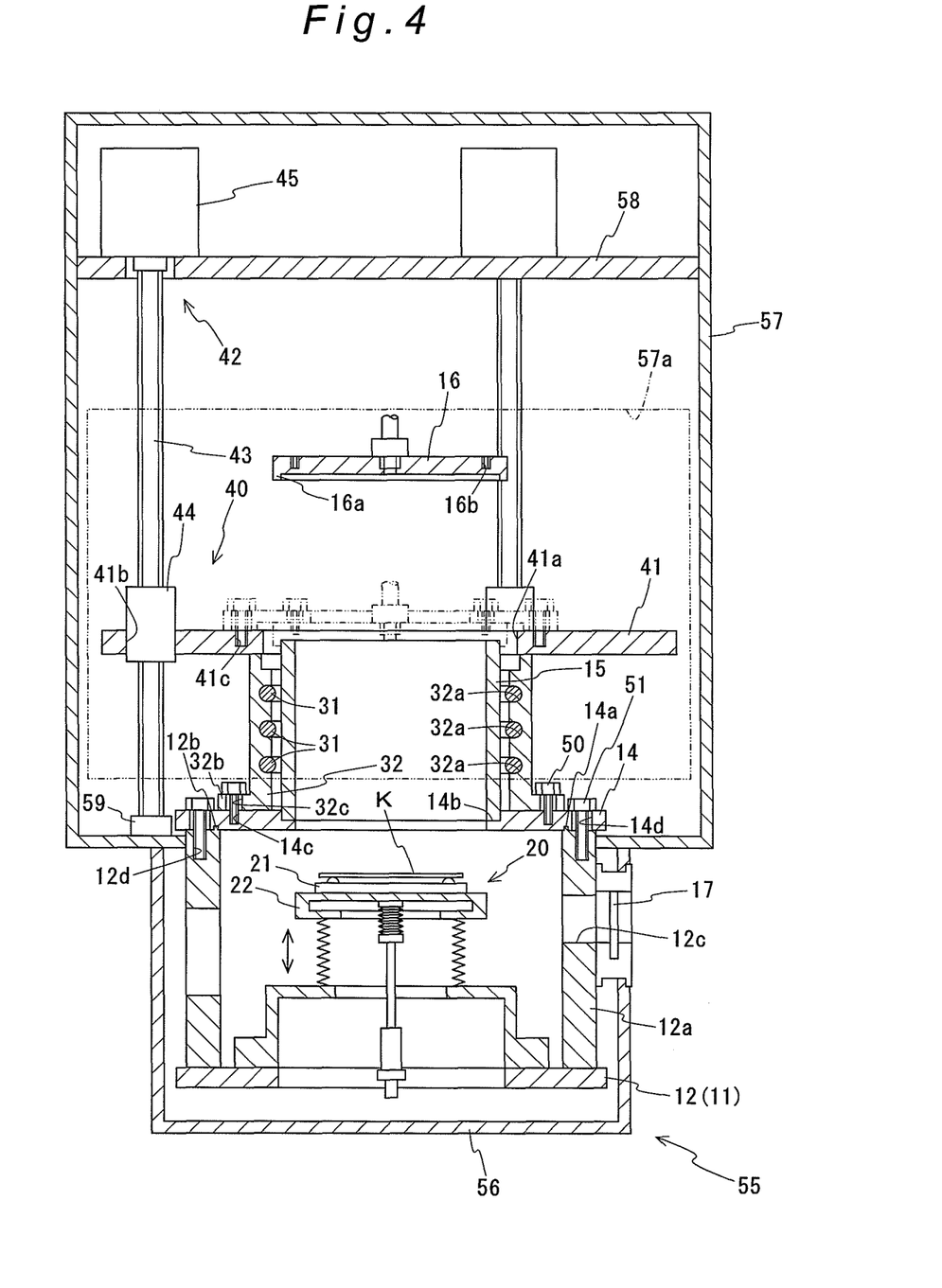
FIG. 4 is a sectional view showing a state where a top plate and other components are detached.

That is, when maintenance is performed on the top plate 16 of the upper chamber 13, as shown in FIG. 4, after the connection and fixing between the elevating board 41 and the top plate 16 is released by unfastening the first fixing bolts 48, 49 and detaching the fixing board 47, only the top plate 16 can be detached. Therefore, it is possible to easily detach the top plate 16 from the etching apparatus 1 to perform maintenance thereon. After finishing the maintenance, the top plate 16 is placed on the upper end portion of the sidewall member 15 so that the upper end of the sidewall member 15 is fitted inside the engagement protrusion 16a, and then the top plate 16 is connected and fixed to the elevating board 41 using the fixing board 47 and the first fixing bolts 48, 49. Thus, the etching apparatus 1 can be easily assembled.

Figure 5:
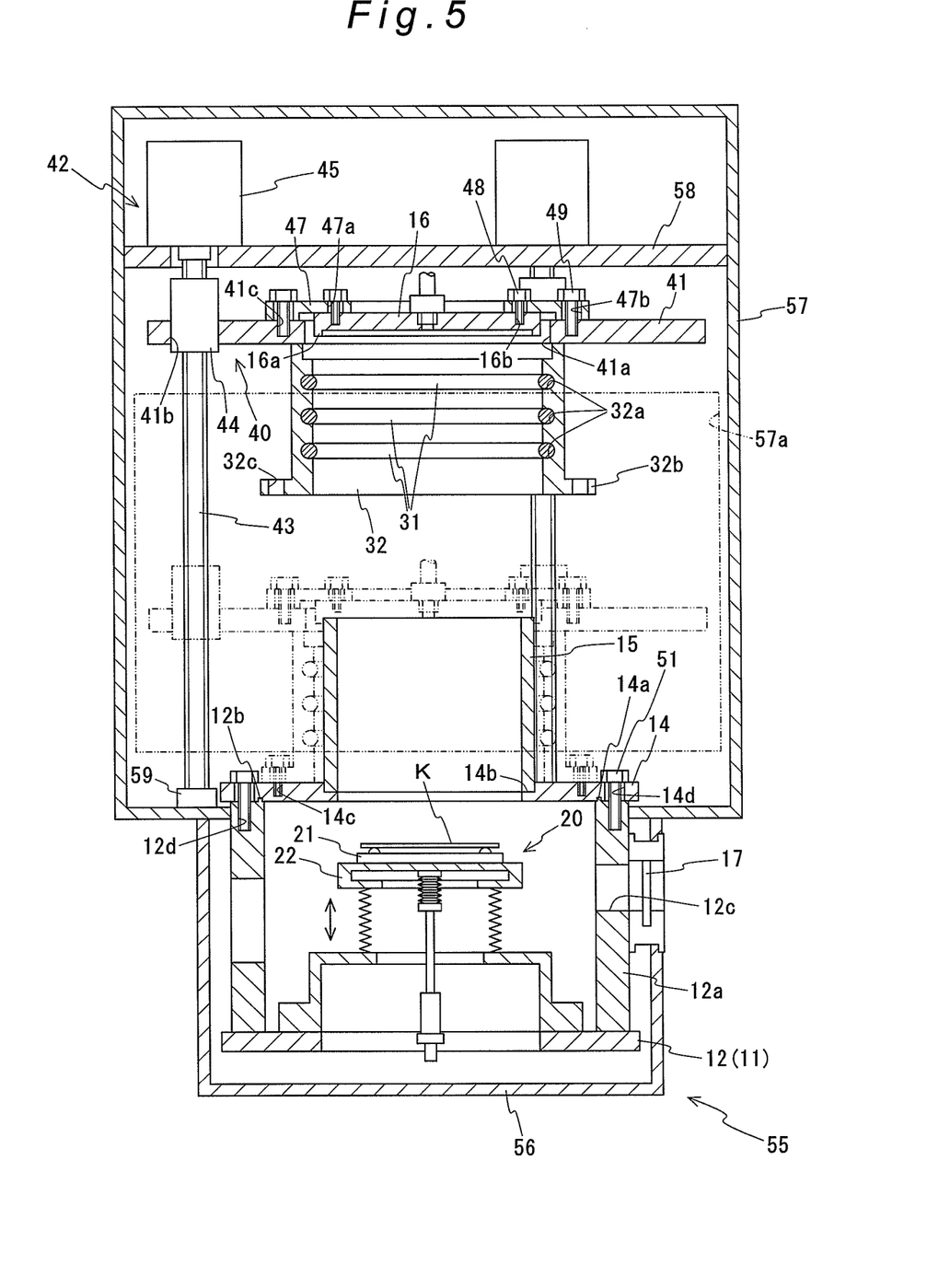
FIG. 5 is a sectional view showing a state where the top plate, an elevating board, a holding member and other components are moved up.

When maintenance is performed on the sidewall member 15 of the upper chamber 13, as shown in FIG. 5, after the fixing of the flange portion 32b of the holding member 32 to the annular plate 14 is initially released by unfastening the second fixing bolts 50, and then the drive motors 45 are driven and thereby the top plate 16, the first fixing bolts 48, 49, the coils 31 and the holding member 32 are moved up together with the elevating board 41, only the sidewall member 15 can be detached. Therefore, it is possible to easily detach the sidewall member 15 from the etching apparatus 1 to perform maintenance thereon. After finishing the maintenance, the sidewall member 15 is placed on the annular plate 14 so that the lower end of the sidewall member 15 is fitted within the engagement concave 14b of the annular plate 14, and then the drive motors 45 are rotated and thereby the top plate 16, the first fixing bolts 48, 49, the coils 31 and the holding member 32 are moved down together with the elevating board 41 to a downward movement end position, that is, they are moved downward until the top plate 16 is placed on the upper end portion of the sidewall member 15. Thereafter, the flange portion 32b of the holding member 32 is fixed to the annular plate 14 by the second fixing bolts 50. Thus, the etching apparatus 1 can be easily assembled.

Further, when maintenance is performed on the annular plate 14 of the upper chamber 13, after, in the state where the sidewall member 15 is detached, the fixing of the annular plate 14 to the sidewall 12a of the lower chamber 12 is released by unfastening the third fixing bolts 51, the annular plate 14 can be easily detached from the etching apparatus 1 to perform maintenance thereon. After finishing the maintenance, the annular plate 14 is placed on the upper end surface of the sidewall 12a of the lower chamber 12 so that the engagement protrusion 12b of the sidewall 12a of the lower chamber 12 is fitted into the engagement groove 14a of the annular plate 14, and then the annular plate 14 is fixed to the sidewall 12a of the lower chamber 12 by the third fixing bolts 51 and the sidewall member 15 is placed on the annular plate 14. Thereafter, the drive motors 45 are rotated and thereby the elevating board 41 is moved down to the downward movement end position (the position of the elevating board 41 when the top plate 16 is placed on the upper end portion of the sidewall member 15), and then the flange portion 32b of the holding member 32 is fixed to the annular plate 14 by the second fixing bolts 50. Thus, the etching apparatus 1 can be easily assembled.

Figure 6:
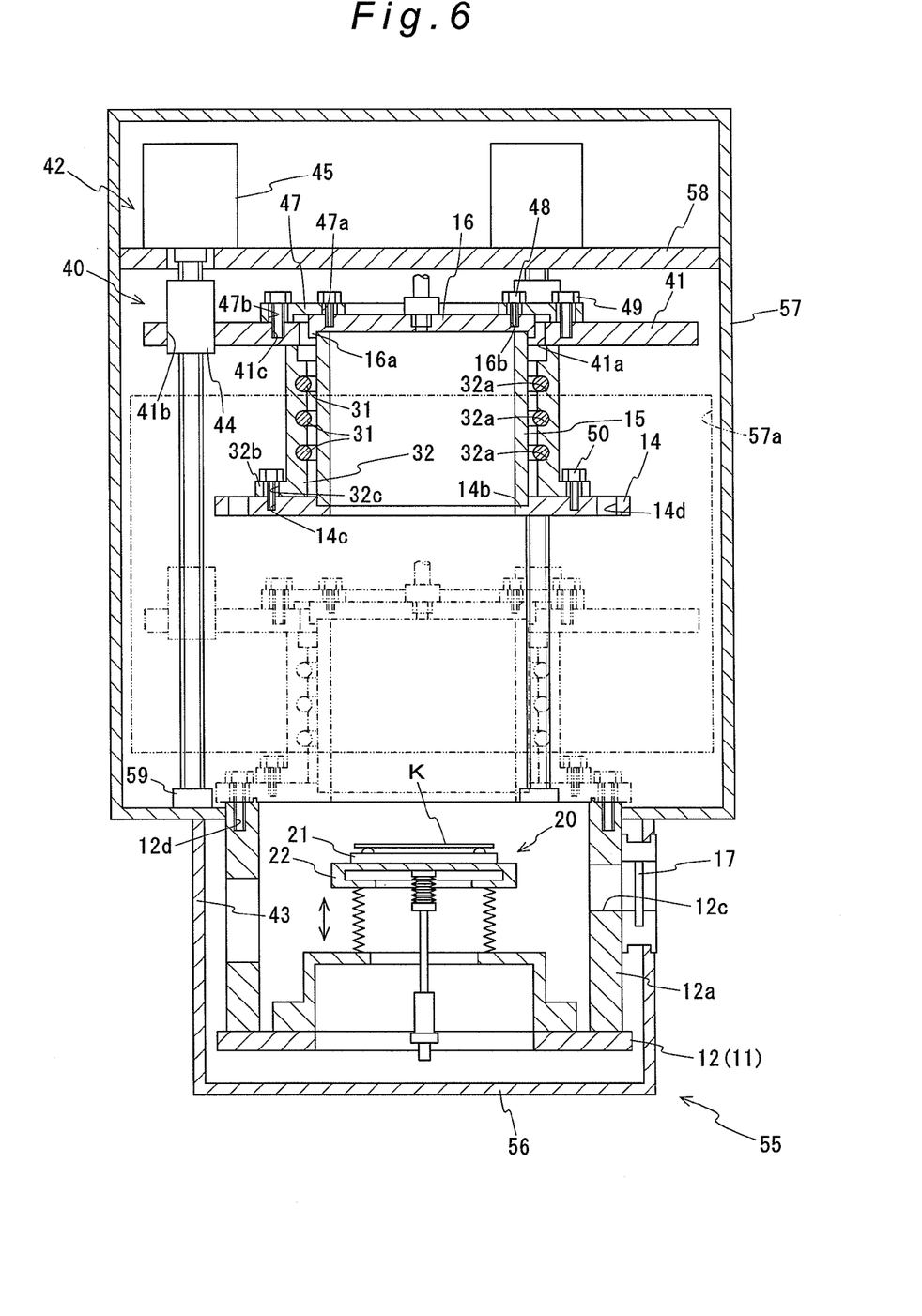
FIG. 6 is a sectional view showing a state where the elevating board, an upper chamber and other components are moved up.

When maintenance is performed on the lower chamber 12, after the fixing of the annular plate 14 to the sidewall 12a of the lower chamber 12 is initially released by unfastening the third fixing bolts 51, and then the drive motors 45 are rotated and thereby the top plate 16, the first fixing bolts 48, 49, the coils 31, the holding member 32, the annular plate 14, the sidewall member 15 and the second fixing bolts 50 are moved up together with the elevating board 41, that is, the whole upper chamber 13 is moved up, the lower chamber 12 is opened and thereby maintenance of the lower chamber 12 can be easily performed. After finishing the maintenance, the drive motors 45 are rotated and thereby the top plate 16, the first fixing bolts 48, 49, the coils 31, the holding member 32, the annular plate 14, the sidewall member 15 and the second fixing bolts 50 are moved down together with the elevating board 41 to a downward movement end position, that is, they are moved downward until the lower surface of the annular plate 14 is brought into contact with the upper end surface of the sidewall 12a of the lower chamber 12. Thereafter, the annular plate 14 is fixed to the sidewall 12a of the lower chamber 12 by the third fixing bolts 51. Thus, the etching apparatus 1 can be easily assembled.

It is noted that in performing maintenance, the operator executes the operations through the operation hole 57 with the door 60 open.

Thus, according to the etching apparatus 1 of the embodiment, releasing the fixing of the top plate 16 by the first fixing bolts 48, 49 and the fixing board 47 and moving up the elevating board 41 by means of the elevating mechanism 42 after releasing the fixing of the annular plate 14 by the second fixing bolts 50 and/or the fixing of the annular plate 14 by the third fixing bolts 51 enable a part which is a maintenance target, of the parts configuring the processing chamber 11, to be easily detached from the etching apparatus 1. Further, when returning the part after maintenance, it is necessary only to perform the reverse of the operation for detaching the part. Therefore, it is possible to perform maintenance such as exchanging or cleaning a target part easily and in a short time.

In attaching the part after finishing the maintenance, the top plate 16 can be positioned with respect to the sidewall member 15 by fitting the upper end of the sidewall member 15 inside the engagement protrusion 16a of the top plate 16, the sidewall member 15 can be positioned with respect to the annular plate 14 by fitting the lower end of the sidewall member 15 within the engagement concave 14b of the annular plate 14, and the annular plate 14 can be positioned with respect to the sidewall 12a by fitting the engagement protrusion 12b of the sidewall 12a of the lower chamber 12 into the engagement groove 14a of the annular plate 14. Therefore, it is possible to facilitate the operations for attaching the top plate 16, the sidewall member 15 and the annular plate 14 which have been detached, and it is possible to prevent reduction of assembly accuracy.

Further, since the processing chamber 11 and the elevating device 40 are covered with the cover body 55, the operator is prevented from being injured during the operations of the elevating board 41 and the elevating mechanism 42 and the high-frequency is prevented from affecting the operator's body, thereby protecting the operator.

Thus, one embodiment of the present invention has been described. However, the mode in which the present invention can be realized is not limited thereto.

In the above embodiment, the elevating board 41 is connected and fixed to the annular plate 14 by the holding member 32 and the second fixing bolts 50. However, the fixing manner is not limited thereto and the elevating board 41 may be fixed to the annular plate 14 by providing, in addition to the holding member 32, a connecting member the upper portion of which is fixed to the lower surface of the elevating board 41 and fixing the lower portion of the connecting member to the annular plate 14 by means of the second fixing bolts 50.

The configuration of the upper chamber 13 is not limited to the configuration described above, and the upper chamber 13 may be configured to have components other than the annular plate 14, the sidewall member 15 and the top plate 16. Further, the etching apparatus 1 may further have a heater for heating the upper chamber 13, and a cooling device for cooling the upper chamber 13. In this case, it is preferable to detachably attach the heater and the cooling device to the elevating board 41 because this allows easy maintenance.

In the above embodiment, etching is provided as an example of plasma processing. However, the type of plasma processing is not limited thereto and the plasma processing apparatus of the present invention can be applied to ashing, decomposition and the like. Further, a substrate which is a target for plasma processing is not limited to a silicon substrate K and any substrate such as glass substrate can be used.

INDUSTRIAL APPLICABILITY

As described in detail above, the present invention is preferably applicable to a plasma processing apparatus in which it is possible to efficiently perform maintenance of a processing chamber.

What is claimed is:

1. A plasma processing apparatus comprising:
a processing chamber configured in a vertically two-divided configuration of an upper chamber and a lower chamber, the lower chamber having a substrate disposed therein;
gas supply means for supplying a processing gas into the upper chamber;
plasma generating means for forming a plasma from a processing gas supplied into the upper chamber; and
voltage applying means for applying high-frequency voltage to the plasma generating means,
the lower chamber having an inner space open at a top thereof, the upper chamber having an inner space open at a bottom thereof, said inner spaces communicating with each other,
wherein the plasma processing apparatus further comprises
an elevating board which is disposed horizontally and provided to be vertically movable and to which at least a part of members configuring the upper chamber are connected,
elevating means for supporting and moving up and down the elevating board, and
at least three fixing means, first, second and third fixing means, for fixing the upper chamber;
the upper chamber is configured from at least an annular plate, wherein a lower surface on an outer peripheral side of which, is in contact with an upper portion of the lower chamber, a sidewall member which is formed in a hollow cylindrical shape and a lower end portion of which is placed on the annular plate, and a top plate which is placed on an upper end portion of the sidewall member;
the elevating board has a vertically penetrating through hole having a size that the top plate can pass therethrough, and the elevating board is disposed at a position wherein the at least part of members configuring the upper chamber can pass through the vertically penetrating through hole in the vertical direction;
the plasma generating means is disposed outside an outer periphery of the sidewall member in a radial direction and fixed on a lower surface of the elevating board;
the first fixing means is configured to connect and fix the elevating board and the top plate from outside them and to be capable of releasing the connection and fixing from outside them;
the second fixing means is configured to connect and fix the elevating board and the annular plate from outside them and to be capable of releasing the connection and fixing from outside them; and
the third fixing means is configured to fix the annular plate to the lower chamber from outside them and to be capable of releasing the fixing from outside them.

2. The plasma processing apparatus as set forth in claim 1, wherein engagement portions are formed on the top plate and at the upper end portion of the sidewall member respectively, the engagement portions engaging with each other to position the top plate with respect to the sidewall member.

3. The plasma processing apparatus as set forth in claim 1, wherein engagement portions are formed in the lower surface of the annular plate and at the upper portion of the lower chamber respectively, the engagement portions engaging with each other to position the annular plate with respect to the lower chamber.

4. The plasma processing apparatus as set forth in claim 2, wherein the apparatus further comprises a cover body for covering at least the elevating board, the elevating means and the upper chamber, and
the cover body has an operation hole penetrating from an outside to an inside thereof at a lateral position relative to the upper chamber, and a door for opening and closing the operation hole.

5. The plasma processing apparatus as set forth in claim 4, wherein the apparatus further comprises a cover body for covering at least the elevating board, the elevating means and the upper chamber, and
the cover body has an operation hole penetrating from an outside to an inside thereof at a lateral position relative to the upper chamber, and a door for opening and closing the operation hole.

6. The plasma processing apparatus as set forth in claim 1, wherein engagement portions are formed on the annular plate and at the lower end portion of the sidewall member respectively, the engagement portions engaging with each other to position the sidewall member with respect to annular plate.

7. The plasma processing apparatus as set forth in claim 1, wherein the apparatus further comprises a cover body for covering at least the elevating board, the elevating means and the upper chamber, and
the cover body has an operation hole penetrating from an outside to an inside thereof at a lateral position relative to the upper chamber, and a door for opening and closing the operation hole.

8. The plasma processing apparatus as set forth in claim 6, wherein the apparatus further comprises a cover body for covering at least the elevating board, the elevating means and the upper chamber, and
the cover body has an operation hole penetrating from outside to an inside thereof at a lateral position relative to the upper chamber, and a door for opening and closing the operation hole.

9. The plasma processing apparatus as set forth in claim 1, wherein
the elevating means comprises a ball screw which passes through a mounting hole formed in the elevating board and which is arranged so that its axis is aligned along the vertical direction and it is rotatable about its axis, a nut which is inserted into the mounting hole of the elevating board and fixed in a state of being screwed onto the ball screw, and a drive motor which drives the ball screw.

10. The plasma processing apparatus as set forth in claim 9, wherein
the apparatus further comprises a cover body for covering at least the elevating board, the elevating means and the upper chamber, and
the cover body has an operation hole penetrating from an outside to an inside thereof at a lateral position relative to the upper chamber, and a door for opening and closing the operation hole.

11. A plasma processing apparatus comprising:
a processing chamber configured in a vertically two-divided configuration of an upper chamber and a lower chamber, the lower chamber having a substrate disposed therein;
gas supply mechanism for supplying a processing gas into the upper chamber;
plasma generating mechanism for forming a plasma from a processing gas supplied into the upper chamber; and voltage applying mechanism for applying high-frequency voltage to the plasma generating mechanism, the lower chamber having an inner space open at a top thereof, the upper chamber having an inner space open at a bottom thereof, said inner spaces communicating with each other, wherein the plasma processing apparatus further comprises an elevating board which is disposed horizontally and provided to be vertically movable and to which at least a part of members configuring the upper chamber are connected, elevating mechanism for supporting and moving up and down the elevating board, and at least three fixing mechanisms, first, second and third fixing mechanisms, for fixing the upper chamber;

the upper chamber is configured from at least an annular plate wherein a lower surface on an outer peripheral side of which; is in contact with an upper portion of the lower chamber, a sidewall member which is formed in a hollow cylindrical shape and a lower end portion of which is placed on the annular plate, and a top plate which is placed on an upper end portion of the sidewall member;

the elevating board has a vertically penetrating through hole having a size that the top plate can pass therethrough, and the elevating board is disposed at a position wherein the at least part of members configuring the upper chamber can pass through the vertically penetrating through hole in the vertical direction;

the plasma generating mechanism is disposed outside an outer periphery of the sidewall member in a radial direction and fixed on a lower surface of the elevating board;

the first fixing mechanism is configured to connect and fix the elevating board and the top plate with a first element partially disposed on an upper side of the elevating board and the top plate, and the first fixing mechanism is capable of releasing the connection between the elevating board and the top plate;

the second fixing mechanism is configured to connect and fix the elevating board and the annular plate with a second element partially disposed on an upper side of the elevating board and the annular plate, and the second fixing mechanism is capable of releasing the connection between the elevating board and the annular plate; and the third fixing mechanism is configured to fix the annular plate to the lower chamber with a third element partially disposed on an upper side of the annular plate, and the third fixing mechanism is capable of releasing the fix between the annular plate and the lower chamber.

12. The plasma processing apparatus as set forth in claim 11, wherein engagement portions are formed on the top plate and at the upper end portion of the sidewall member respectively, the engagement portions engaging with each other to position the top plate with respect to the sidewall member.

13. The plasma processing apparatus as set forth in claim 11, wherein engagement portions are formed in the lower surface of the annular plate and at the upper portion of the lower chamber respectively, the engagement portions engaging with each other to position the annular plate with respect to the lower chamber.

14. The plasma processing apparatus as set forth in claim 12, wherein the apparatus further comprises a cover body for covering at least the elevating board, the elevating mechanism and the upper chamber, and the cover body has an operation hole penetrating from an outside to an inside thereof at a lateral position relative to the upper chamber, and a door for opening and closing the operation hole.

15. The plasma processing apparatus as set forth in claim 13, wherein the apparatus further comprises a cover body for covering at least the elevating board, the elevating mechanism and the upper chamber, and the cover body has an operation hole penetrating from an outside to an inside thereof at a lateral position relative to the upper chamber, and a door for opening and closing the operation hole.

16. The plasma processing apparatus as set forth in claim 11, wherein engagement portions are formed on the annular plate and at the lower end portion of the sidewall member respectively, the engagement portions engaging with each other to position the sidewall member with respect to annular plate.

17. The plasma processing apparatus as set forth in claim 11, wherein the apparatus further comprises a cover body for covering at least the elevating board, the elevating mechanism and the upper chamber, and the cover body has an operation hole penetrating from an outside to an inside thereof at a lateral position relative to the upper chamber, and a door for opening and closing the operation hole.

18. The plasma processing apparatus as set forth in claim 16, wherein the apparatus further comprises a cover body for covering at least the elevating board, the elevating mechanism and the upper chamber, and the cover body has an operation hole penetrating from an outside to an inside thereof at a lateral position relative to the upper chamber, and a door for opening and closing the operation hole.

19. The plasma processing apparatus as set forth in claim 11, wherein the elevating mechanism comprises a ball screw which passes through a mounting hole formed in the elevating board and which is arranged so that a longitudinal axis of the ball screw is aligned along the vertical direction and the ball screw is rotatable about the longitudinal axis, a nut which is inserted into the mounting hole of the elevating board and the nut is screwed onto the ball screw, and a drive motor for driving the ball screw.

20. The plasma processing apparatus as set forth in claim 19, wherein the apparatus further comprises a cover body for covering at least the elevating board, the elevating mechanism and the upper chamber, and the cover body has an operation hole penetrating from an outside to an inside thereof at a lateral position relative to the upper chamber, and a door for opening and closing the operation hole.

* * * * *